United States Patent
Tong

(10) Patent No.: US 12,433,094 B2
(45) Date of Patent: Sep. 30, 2025

(54) DISPLAY PANEL AND DISPLAY DEVICE HAVING REDUCED DISPLAY DIFFERENCE BETWEEN LIGHT COLLECTION AREA AND NON-LIGHT COLLECTION AREA

(71) Applicant: Hubei Yangtze Industrial Innovation Center of Advanced Display Co., LTD., Wuhan (CN)

(72) Inventor: Xiaoyang Tong, Wuhan (CN)

(73) Assignee: Hubei Yangtze Industrial Innovation Center of Advanced Display Co., LTD., Wuhan (CN)

( * ) Notice: Subject to any disclaimer, the term of this patent is extended or adjusted under 35 U.S.C. 154(b) by 540 days.

(21) Appl. No.: 17/895,764

(22) Filed: Aug. 25, 2022

(65) Prior Publication Data
US 2024/0008306 A1   Jan. 4, 2024

(30) Foreign Application Priority Data
Jun. 30, 2022   (CN) .......................... 202210760347.0

(51) Int. Cl.
  H10K 50/86   (2023.01)
  H10K 59/122  (2023.01)
(52) U.S. Cl.
  CPC ......... H10K 50/865 (2023.02); H10K 59/122 (2023.02)
(58) Field of Classification Search
  None
  See application file for complete search history.

(56) References Cited

U.S. PATENT DOCUMENTS

| | | | | |
|---|---|---|---|---|
| 2021/0202621 A1* | 7/2021 | Liang | ................... | H10K 59/124 |
| 2021/0397806 A1* | 12/2021 | Lu | .......................... | G06V 10/143 |
| 2023/0056074 A1* | 2/2023 | Yue | ......................... | H10K 39/34 |
| 2023/0217716 A1* | 7/2023 | Shen | .................... | H10K 59/122 |
| | | | | 257/40 |

FOREIGN PATENT DOCUMENTS

| | | | | | |
|---|---|---|---|---|---|
| CN | 108899344 A | | 11/2018 | | |
| CN | 111312792 A | | 6/2020 | | |
| CN | 111697039 A | * | 9/2020 | ............... | G09F 9/33 |
| CN | 113206121 A | | 8/2021 | | |
| CN | 113363305 A | | 9/2021 | | |
| CN | 115132944 A | | 9/2022 | | |

\* cited by examiner

*Primary Examiner* — Nduka E Ojeh
(74) *Attorney, Agent, or Firm* — Anova Law Group, PLLC

(57) ABSTRACT

Display panel and display device are provided. The display panel includes a substrate, a light-emitting layer on a first side of the substrate, and a light-shielding layer on a side of the light-emitting layer away from the substrate. A first area of the light-shielding layer includes a plurality of first light-transmitting holes, and a second area of the light-shielding layer includes a plurality of second light-transmitting holes. The display panel includes a first display area and a second display area, the first display area is a light collection area, the first area of the light-shielding layer is in a non-opening area of the first display area, and the second area of the light-shielding layer is in a non-opening area of the second display area.

19 Claims, 11 Drawing Sheets

DISPLAY PANEL AND DISPLAY DEVICE HAVING REDUCED DISPLAY DIFFERENCE BETWEEN LIGHT COLLECTION AREA AND NON-LIGHT COLLECTION AREA

CROSS-REFERENCE TO RELATED APPLICATION

This application claims priority of Chinese Patent Application No. 202210760347.0, filed on Jun. 30, 2022, the entire contents of which are hereby incorporated by reference.

FIELD OF THE DISCLOSURE

The present disclosure generally relates to the field of display technology and, more particularly, relates to a display panel and a display device.

BACKGROUND

With the development of display technology, more and more display devices integrate light sensors, so that the display devices have a function of light acquisition and perform image acquisition or fingerprint recognition based on collected light. To increase a display area of an existing display device, a light collection area is usually set in a display area. However, in practical applications, there is a display effect difference between a display area corresponding to a light collection area and other display areas in a display device, which affects a user's viewing experience.

BRIEF SUMMARY OF THE DISCLOSURE

One aspect of the present disclosure provides a display panel. The display panel includes a substrate, a light-emitting layer on a first side of the substrate, and a light-shielding layer on a side of the light-emitting layer away from the substrate. A first area of the light-shielding layer includes a plurality of first light-transmitting holes, and a second area of the light-shielding layer includes a plurality of second light-transmitting holes. The display panel includes a first display area and a second display area, the first display area is a light collection area, the first area of the light-shielding layer is in a non-opening area of the first display area, and the second area of the light-shielding layer is in a non-opening area of the second display area.

Another aspect of the present disclosure provides a display device. The display device includes a display panel. The display panel includes a substrate, a light-emitting layer on a first side of the substrate, and a light-shielding layer on a side of the light-emitting layer away from the substrate. A first area of the light-shielding layer includes a plurality of first light-transmitting holes, and a second area of the light-shielding layer includes a plurality of second light-transmitting holes. The display panel includes a first display area and a second display area, the first display area is a light collection area, the first area of the light-shielding layer is in a non-opening area of the first display area, and the second area of the light-shielding layer is in a non-opening area of the second display area.

Other aspects of the present disclosure can be understood by a person skilled in the art in light of the description, the claims, and the drawings of the present disclosure.

BRIEF DESCRIPTION OF THE DRAWINGS

To illustrate technical solutions in embodiments of the present disclosure more clearly, the following will briefly introduce accompanying drawings that need to be used in a description of the embodiments. Obviously, the accompanying drawings in the following description are only used for some embodiments of the present disclosure. For a person skilled in the art, other drawings can also be obtained from the accompanying drawings without creative efforts.

Structures, proportions, sizes, and the like illustrated in the accompanying drawings of the specification, in coordination with the content disclosed in the present specification, are only used to help a person skilled in the art to read and understand and are not intended to limit conditions under which the present disclosure can be implemented and therefore have no technical significance. Any modifications to a structure, changes to a proportional relationship or an adjustment on a size should fall within the scope of the technical content disclosed by the present disclosure without affecting effects and objectives that can be achieved by the present disclosure.

DETAILED DESCRIPTION

The embodiments of the present disclosure will be described below clearly and completely in conjunction with the accompanying drawings in the embodiments of the present disclosure. Obviously, the described embodiments are only part of the embodiments of the present disclosure, rather than all the embodiments. Based on the embodiments of the present disclosure, all other embodiments obtained by a person skilled in the art without creative efforts shall fall within the protection scope of the present disclosure.

To make the above objects, features and advantages of the present disclosure more clearly understood, the present disclosure will be described in further detail below in conjunction with the accompanying drawings and specific embodiments.

As described in the background section, there is a display effect difference between a display area corresponding to a light collection area and other display areas in a display device, which affects a user's viewing experience.

The display effect difference described above is because a light sensor in the display device is mainly disposed on a non-display surface of a display panel in the display device. For the light sensor to collect light entering a display surface of the display panel through the display panel, part of the display area of the display panel corresponding to the light sensor (i.e., a light collection area) needs to ensure a certain light transmittance.

Figure 1:
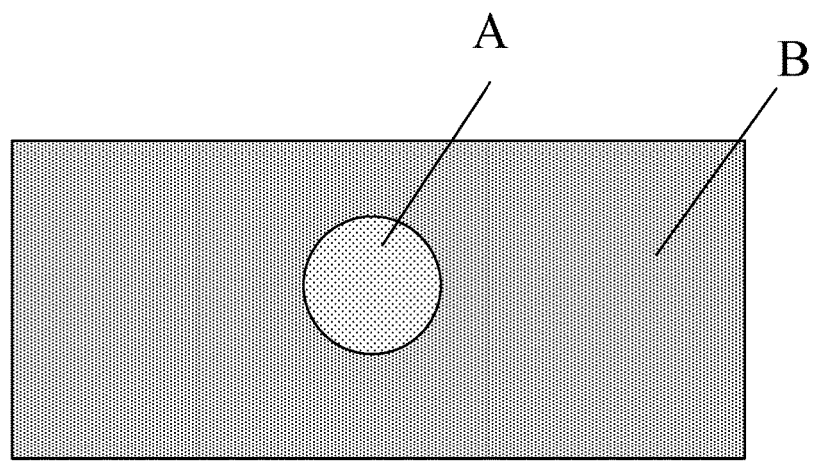
FIG. 1 illustrates a schematic diagram of a display difference between a light-transmitting area and a non-light-transmitting area in a display panel consistent with various embodiments of the present disclosure.

At present, the display panel mainly sets a light-transmitting area in the light collection area of the display panel to ensure a light transmittance of the light collection area. When incident light from the light collection area passes through the light-transmitting area and hits a surface of the light sensor, reflection occurs, resulting in a reflectivity difference between the light-transmitting area and a non-light-transmitting area in the display area of the display panel. Therefore, a display effect of the light-transmitting area and a display effect of the non-light-transmitting area in the display area of the display panel are different. As shown in FIG. 1, area A is a light-transmitting area, and area B is a non-light-transmitting area, thereby resulting in a display difference between a display effect of the light collection area and a display effect of a non-light collection area in the display area of the display panel and affecting a user's viewing experience.

Figure 2:
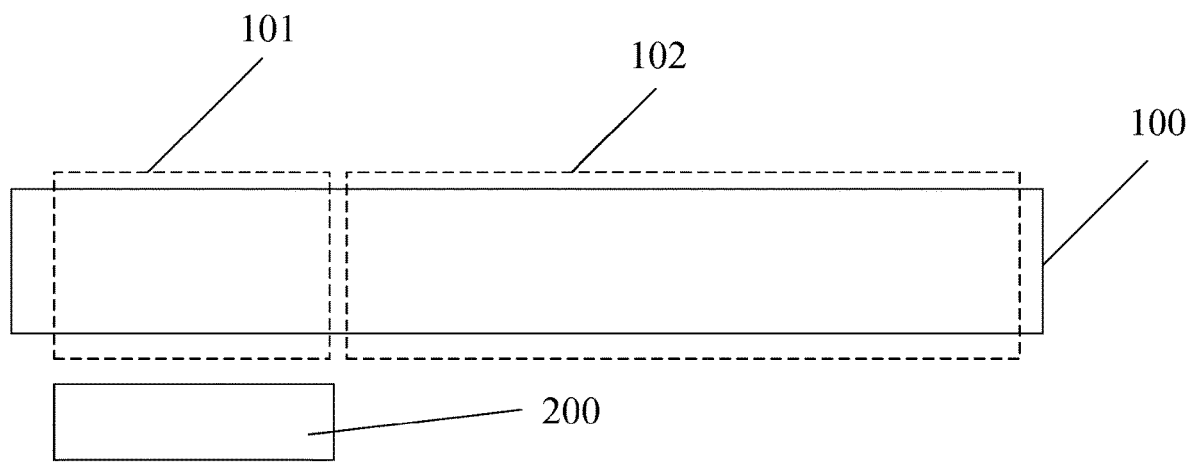
FIG. 2 illustrates a schematic diagram of a display device provided by an embodiment of the present disclosure.
Figure 3:
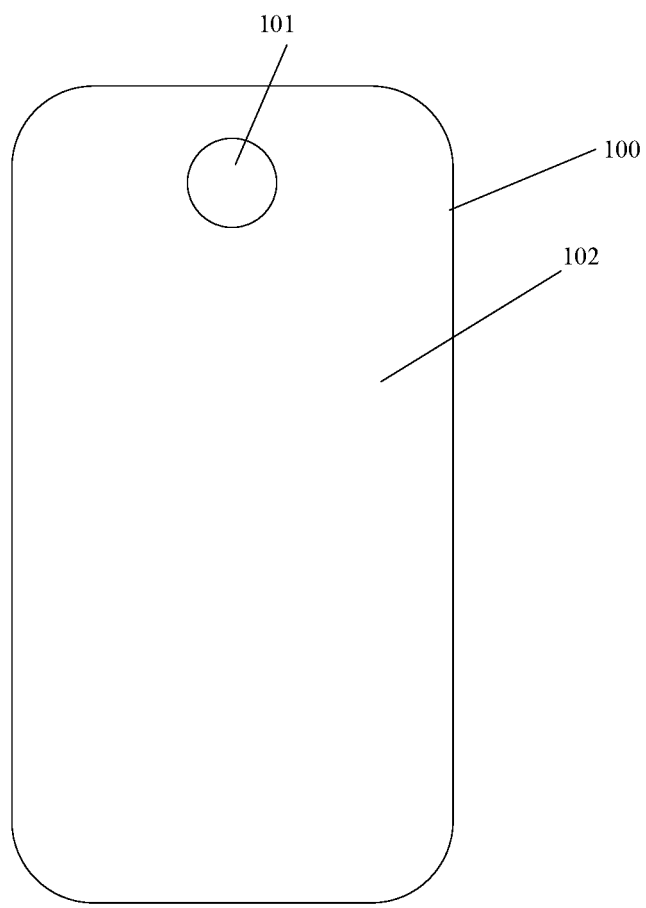
FIG. 3 illustrates a top view of a display panel provided by an embodiment of the present disclosure.

In view of the above, embodiments of the present disclosure provide a display panel and a display device including the display panel. Optionally, as shown in FIG. 2, the display device includes the display panel 100 and a light collection device 200 on a non-display side of the display panel 100. A display area of the display panel 100 includes a light collection area. The light collection device 200 performs light collection based on light transmitted by the light collection area of the display panel. It should be noted that, in the embodiment, as shown in FIG. 2 and FIG. 3, the display panel 100 includes a first display area 101 and a second display area 102. The first display area 101 is a light collection area, the second display area 102 is a non-light collection area. That is, the light collection device is provided on the non-display side of the display panel 100 corresponding to a position of the first display area 101. Light incident on the first display area 101 of the display panel 100 may be emitted from the non-display side of the display panel 100 through the display panel 100 and received by the light collection device 200. A light collection device is not provided on the non-display side of the display panel 100 corresponding to the second display area 102. Light incident on the second display area 102 of the display panel 100 cannot be emitted from the non-display side of the display panel 100.

Figure 4:
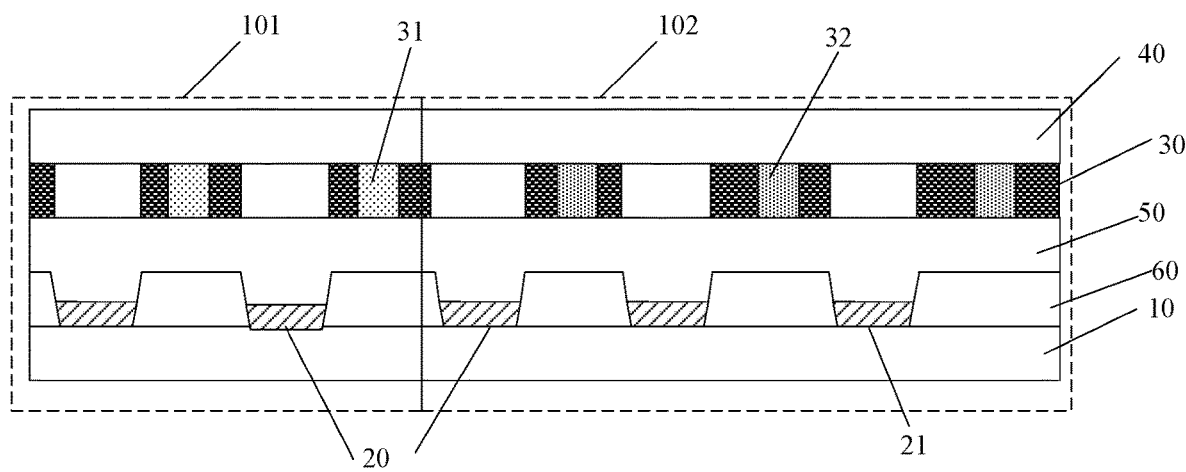
FIG. 4 illustrates a cross-sectional view of a display panel provided by an embodiment of the present disclosure.
Figure 5:
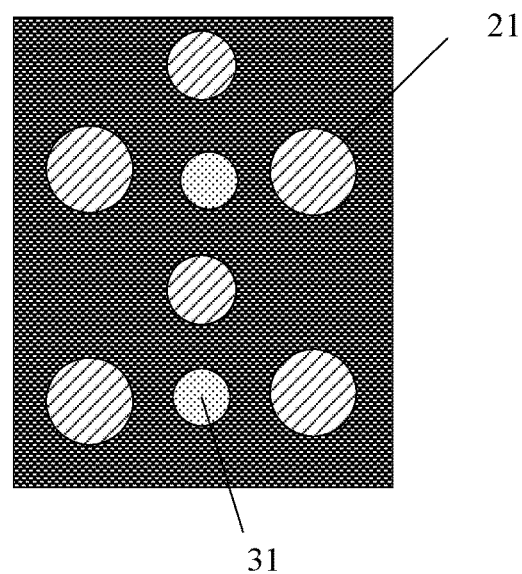
FIG. 5 illustrates a partial top view of a first display area in a display panel provided by an embodiment of the present disclosure.
Figure 6:
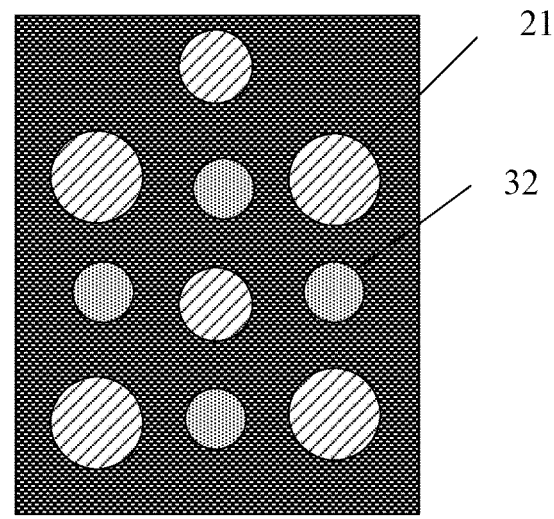
FIG. 6 illustrates a partial top view of a second display area in a display panel provided by an embodiment of the present disclosure.

As shown in FIG. 4, in the embodiment, the display panel includes a substrate 10, a light-emitting layer 20 on a first side of the substrate 10, and a light-shielding layer 30 on a side of the light-emitting layer 20 away from the substrate 10. A first area of the light-shielding layer includes a plurality of first light-transmitting holes 31, and a second area of the light-shielding layer 30 includes a plurality of second light-transmitting holes 32. It should be noted that, in the embodiment, as shown in FIGS. 4-6, the first area is in a non-opening area of the first display area 101, the second area is in a non-opening area of the second display area 102, that is, the first light-transmitting holes 31 are in the non-opening area of the first display area 101, and the second light-transmitting holes 32 are in the non-opening area of the second display area 102. Optionally, the display panel further includes a cover plate 40 on a side of the light-shielding layer away from the substrate.

Specifically, based on the above embodiment, in one embodiment of the present disclosure, as shown in FIG. 4, the display panel further includes an encapsulation film 50 encapsulating the light-emitting layer 20 and the pixel definition layer 60 between the substrate 10 and the encapsulation film 50. The pixel definition layer 60 includes a plurality of openings. The light-emitting layer 20 includes a plurality of light-emitting units 21. The plurality of light-emitting units 21 corresponds to the plurality of openings one-to-one and are in the plurality of openings. It should be noted that, in the embodiment, an area where the light-emitting units 21 are located is an opening area of the display panel. An area excluding the opening area in the display area of the display panel is a non-opening area.

In the display panel provided by the embodiments of the present disclosure, in addition that the first light-transmitting holes are disposed in the non-opening area of the first display area so that the first display area includes a light collection area, the second light-transmitting holes are disposed in the non-opening area of the second display area. That is, in addition that the first light-transmitting holes are disposed in the light collection area, the second light-transmitting holes are also disposed in the non-light collection area. Therefore, by disposing light-transmitting holes in the non-opening area of the display area (i.e., the second display area) of the non-light collection area, a reflectivity of the display area (i.e., the second display area) of the non-light collection area is increased, thereby reducing a reflectivity difference between the light collection area and the non-light collection area, that is, reducing a reflectivity difference between the first display area and the second display area. Further, a display difference between the light collection area and the non-light collection area is reduced, that is, a display difference between the first display area and the second display area is reduced, thereby improving a user's viewing experience.

Optionally, in one embodiment of the present disclosure, a reflectivity per unit area of the first display area and a reflectivity per unit area of the second display area meet equal conditions, to reduce the display difference between the first display area and the second display area and improve a user's viewing experience. The reflectivity per unit area of the first display area and the reflectivity per unit area of the second display area meeting equal conditions includes the reflectivity per unit area of the first display area being equal to the reflectivity per unit area of the second display area and includes a reflectivity of an area where the first light-transmitting holes are located being approximately equal to a reflectivity of an area where the second light-transmitting holes are located.

It should be noted that, in the above embodiment, the pixel definition layer may be a transparent film layer or an opaque film layer, which is not limited herein, and will be described below with reference to specific situations.

Specifically, in one embodiment of the present disclosure, as shown in FIG. 4, the pixel definition layer 60 is a transparent film layer. It should be noted that, since a transparent film layer can transmit light, in the embodiment, an area of the pixel definition layer 60 corresponding to the first light-transmitting holes 31 may not be provided with openings. Similarly, an area of the pixel definition layer 60 corresponding to the second light-transmitting holes 32 may not be provided with openings, which is not limited herein.

Based on the above embodiment, in one embodiment of the present disclosure, a proportion of the light-transmitting area per unit area of the first display area and a proportion of the light-transmitting area per unit area of the second display area meet equal conditions, so that a reflectivity of the first display area and a reflectivity of the second display area meet equal conditions, thereby reducing the display difference between the first display area and the second display area, and improving a user's viewing experience. It should be noted that, in the embodiment, the proportion of the light-transmitting area per unit area of the first display area and the proportion of the light-transmitting area per unit area of the second display area meeting equal conditions includes the proportion of the light-transmitting area per unit area of the first display area being equal to the proportion of the light-transmitting area per unit area of the second display area and includes a proportion of the light-transmitting area per unit area of the first display area being approximately equal to the proportion of the light-transmitting area per unit area of the second display area.

Based on the above embodiment, in one embodiment of the present disclosure, an area of the first light-transmitting holes and an area of the second light-transmitting holes meet equal conditions, so that the reflectivity of the area where the first light-transmitting holes are located and the reflectivity of the area where the second light-transmitting holes are located meet equal conditions. Therefore, a reflectivity of the first display area and a reflectivity of the second display area meet equal conditions, thereby reducing the display difference between the first display area and the second display area and improving a user's viewing experience.

It should be noted that, in the embodiment, the area of the first light-transmitting holes and the area of the second light-transmitting holes meeting equal conditions includes the area of the first light-transmitting holes being equal to the area of the second light-transmitting holes and includes an area of the first light-transmitting holes being approximately equal to the area of the second light-transmitting holes.

Figure 7:
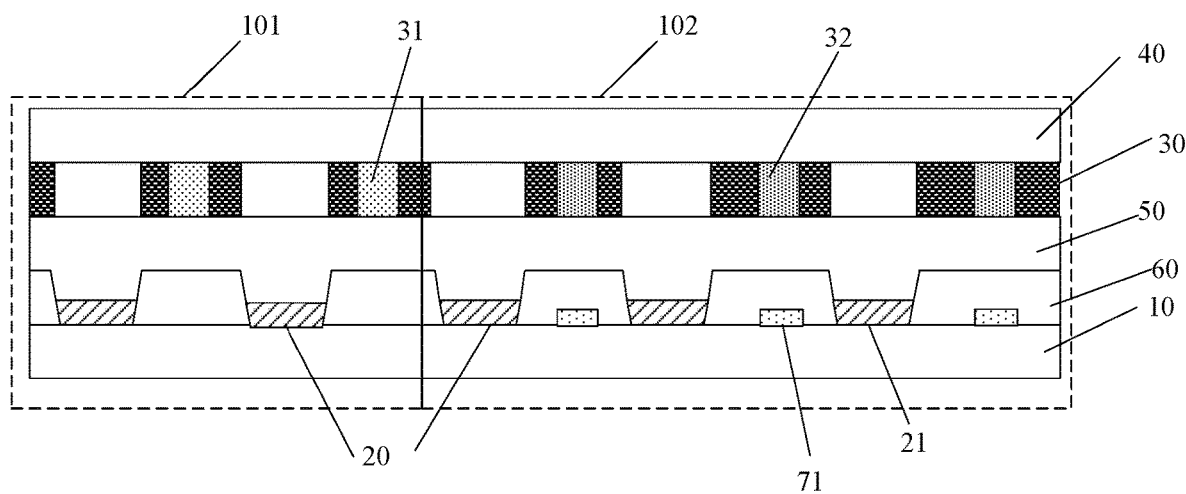
FIG. 7 illustrates a cross-sectional view of a display panel provided by another embodiment of the present disclosure.

In another embodiment of the present disclosure, as shown in FIG. 7, the display panel further includes a metal layer on a side of the pixel definition layer 60 facing the substrate 10. The metal layer includes a plurality of metal units 71. In a direction perpendicular to a plane where the display panel is located, the metal units 71 correspond to the second light-transmitting holes 32 one-to-one, so that the metal units 71 are used to improve a reflectivity of an area where the second light-transmitting holes 32 are located. It should be noted that, since the metal units 71 corresponding to the area where the second light-transmitting holes 32 are located can improve the reflectivity of the area where the second light-transmitting holes 32 are located, in the embodiment, if an area of the second light-transmitting holes 32 is smaller than an area of the first light-transmitting holes 31, the reflectivity of the area where the second light-transmitting holes 32 are located and the reflectivity of the area where the first light-transmitting holes 31 are located can meet equal conditions, thereby reducing an area ratio of the second light-transmitting holes 32 in the second display area. Therefore, the second display area may have a larger area for setting an opening area and/or provide a larger layout space for wiring to increase an aperture ratio of the second display area and reduce a wiring difficulty of the second display area.

Based on the above embodiment, in one embodiment of the present disclosure, the area of the second light-transmitting holes is less than or equal to half the area of the first light-transmitting holes, so as to reduce the area of the second light-transmitting holes as much as possible on the basis that the reflectivity of the area where the second light-transmitting holes are located and the reflectivity of the area where the first light-transmitting holes are located meet equal conditions, thereby reducing a ratio of an area of the second light-transmitting holes in the second display area, increasing the aperture ratio of the second display area, and reducing the wiring difficulty of the second display area.

Figure 8:
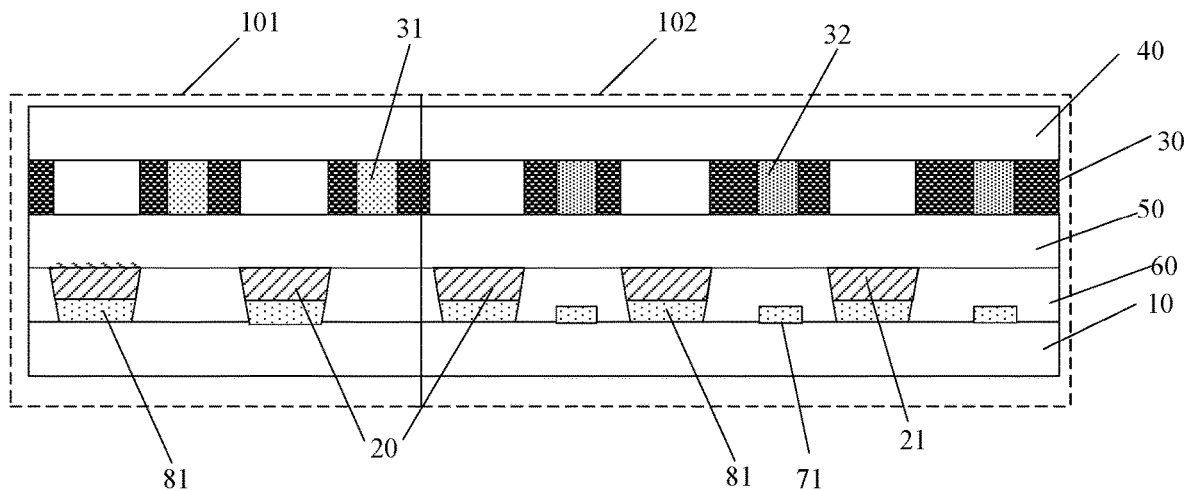
FIG. 8 illustrates a cross-sectional view of a display panel provided by another embodiment of the present disclosure.

Based on the above embodiment, in one embodiment of the present disclosure, as shown in FIG. 8, the display panel further includes an anode layer between the substrate 10 and the light-emitting layer 20. The anode layer is a control electrode layer that controls the light-emitting layer 20 to emit light. Specifically, the anode layer includes a plurality of anode units 81 in one-to-one correspondence with light-emitting units 21.

Figure 9:
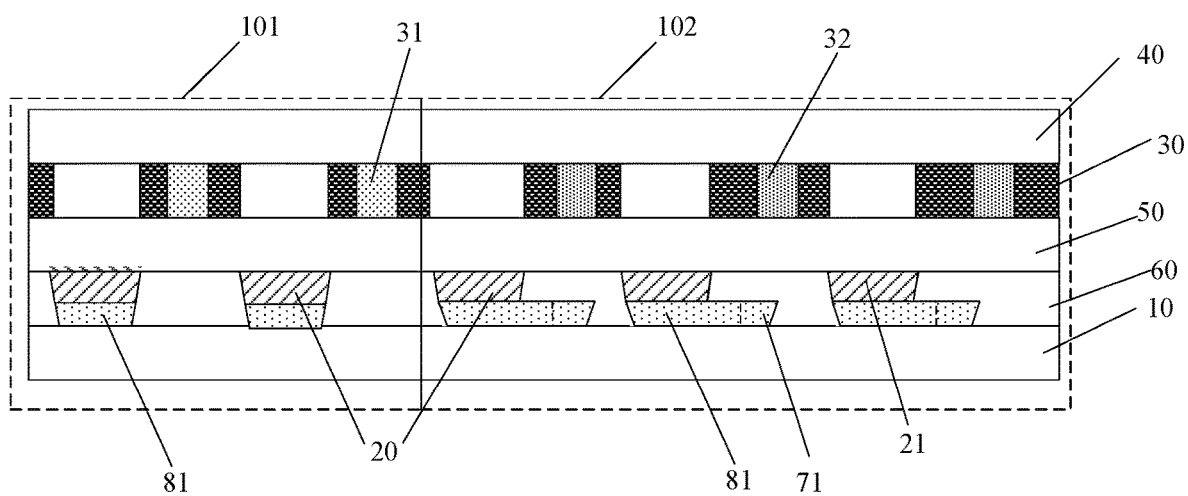
FIG. 9 illustrates a cross-sectional view of a display panel provided by another embodiment of the present disclosure.

Optionally, based on the above embodiment, in one embodiment of the present disclosure, the metal layer and the anode layer are on a same layer, that is, the metal units 71 and the anode units 81 are on a same layer, so that the display panel does not increase a thickness of the display panel due to a provision of the metal layer on the basis of integrating the metal layer, thereby complying with a development trend of the display panel being light and thin. It should be noted that, in the embodiment of the present disclosure, if the normal operation of the light-emitting unit 21 is not affected, the metal units and the anode units may be electrically insulated, as shown in FIG. 8, or may be electrically connected, as shown in FIG. 9, which are not limited herein and depend on a specific situation.

Specifically, based on the above embodiment, in one embodiment of the present disclosure, a ratio of the area of the second light-transmitting holes to the area of the first light-transmitting holes ranges from 20% to 40%, so as to reduce the area of the second light-transmitting holes as much as possible on the basis that the reflectivity of the area where the second light-transmitting holes are located and the reflectivity of the area where the first light-transmitting holes are located meet equal conditions, thereby reducing the ratio of the area of the second light-transmitting holes in the second display area, increasing the aperture ratio of the second display area, and reducing the wiring difficulty of the second display area.

In other embodiments of the present disclosure, the metal layer may also be disposed at another position between a pixel definition layer and the substrate, which is not limited herein and depends on a specific situation.

It should be noted that the above embodiments are described by taking an example that the metal layer is on a side of the pixel definition layer facing the substrate, which is not limited herein. In other embodiments of the present disclosure, the metal layer may also be on a side of the pixel definition layer away from the substrate.

Figure 10:
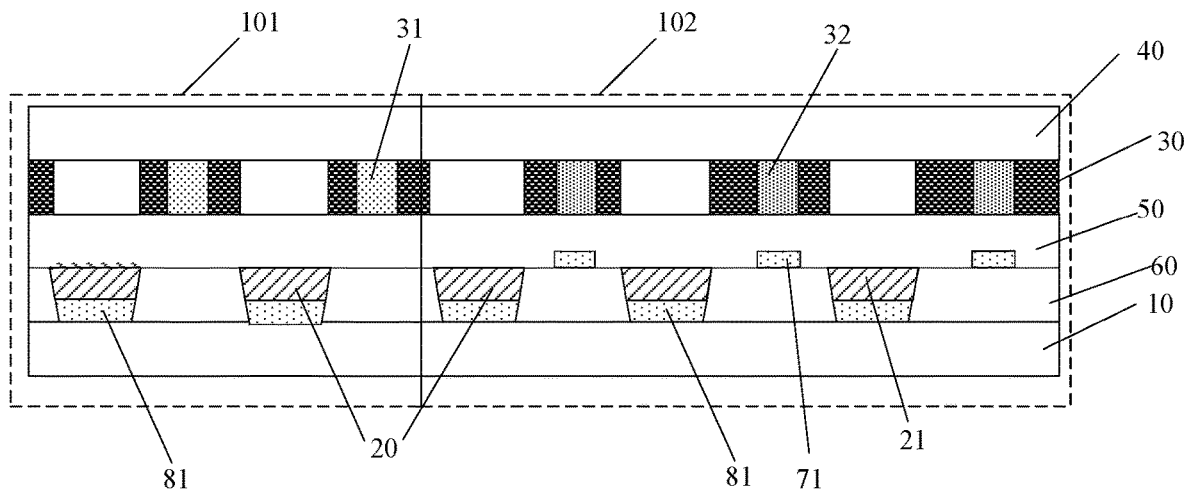
FIG. 10 illustrates a cross-sectional view of a display panel provided by another embodiment of the present disclosure.

Specifically, in one embodiment of the present disclosure, as shown in FIG. 10, the display panel further includes a metal layer between the light-shielding layer 30 and the pixel definition layer 60. The metal layer includes a plurality of metal units 71. In a direction perpendicular to a plane of the display panel, the metal units 71 correspond to the second light-transmitting holes 32 one-to-one. The area of the second light-transmitting holes 32 is smaller than the area of the first light-transmitting holes 31.

Figure 11:
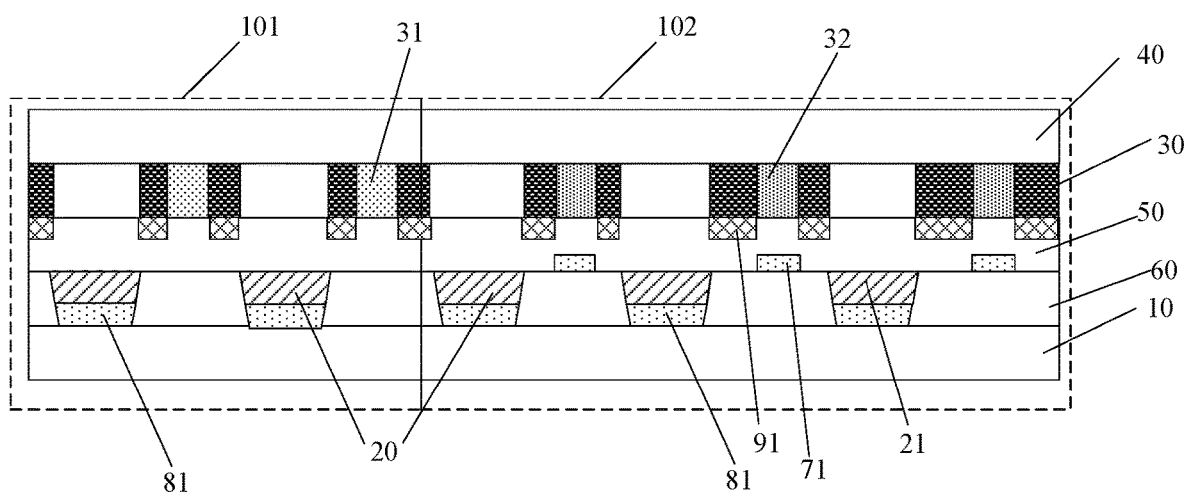
FIG. 11 illustrates a cross-sectional view of a display panel provided by another embodiment of the present disclosure.

Optionally, based on the above embodiment, in one embodiment of the present disclosure, as shown in FIG. 11, the display panel further includes a touch electrode layer on a side of the light-shielding layer 30 facing the light-emitting layer 20. The touch electrode layer includes a plurality of touch electrodes 91, so that the display panel is integrated with a touch function and an integration degree of the display panel is improved.

Figure 12:
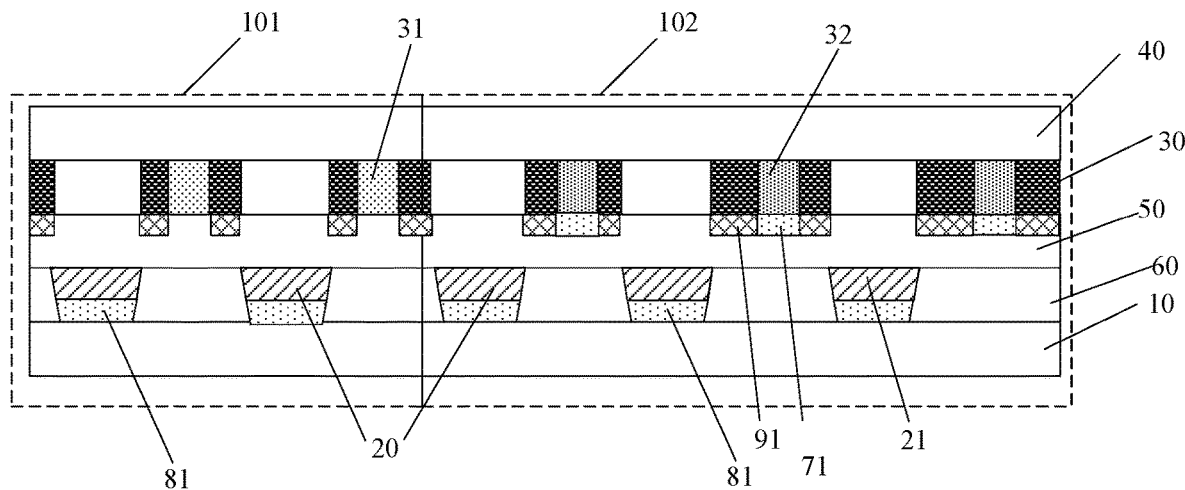
FIG. 12 illustrates a cross-sectional view of a display panel provided by another embodiment of the present disclosure.

Specifically, in one embodiment of the present disclosure, the touch electrodes 91 are metal electrodes to reduce resistances of the touch electrodes 91. It should be noted that, in the embodiment, as shown in FIG. 12, when the display panel further includes metal units, the metal units 71 may also be on a same layer as the touch electrodes 91, thereby not increasing a thickness of the display panel due to an arrangement of the metal units and complying with the development trend of the display panel being light and thin.

Optionally, in the above embodiment, since materials of the touch electrodes and the metal units are metals, in one embodiment of the present disclosure, the touch electrodes can also be multiplexed into metal units, thereby further simplifying a forming process of the display panel, reducing weight and area of the display panel, and complying with the development trend of the display panel being light and thin.

Specifically, based on the above embodiment, in one embodiment of the present disclosure, the ratio of the area of the second light-transmitting holes to the area of the first light-transmitting holes ranges from 40% to 50%, so as to reduce the area of the second light-transmitting holes as much as possible on the basis that the reflectivity of the area where the second light-transmitting holes are located and the reflectivity of the area where the first light-transmitting holes are located meet equal conditions, thereby reducing the ratio of the area of the second light-transmitting holes in the second display area, increasing the aperture ratio of the second display area, and reducing the wiring difficulty of the second display area.

Figure 13:
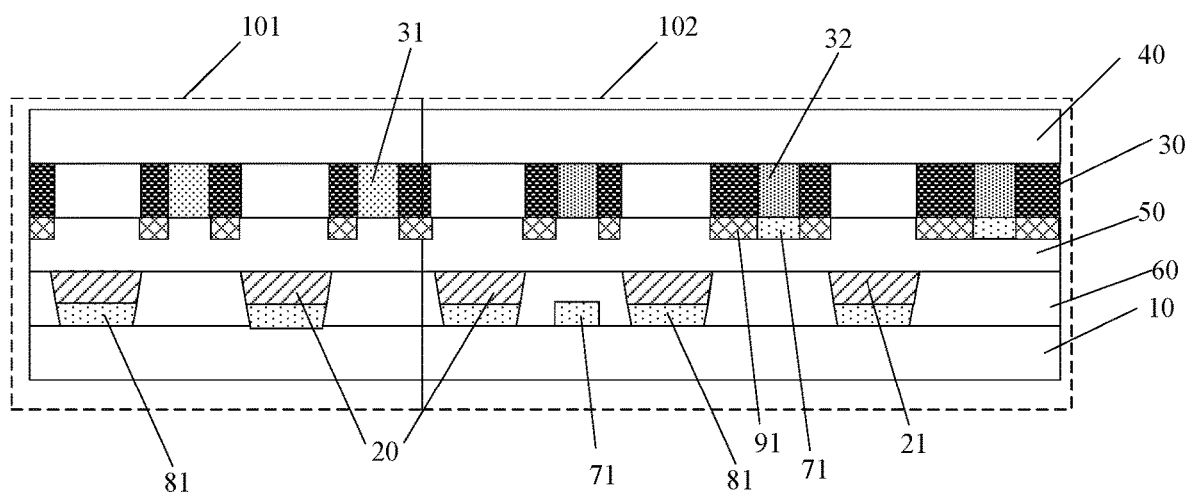
FIG. 13 illustrates a cross-sectional view of a display panel provided by another embodiment of the present disclosure.

In another embodiment of the present disclosure, the display panel includes both an anode layer and a touch electrode layer. That is, in the embodiment, as shown in FIG. 13, the display panel further includes an anode layer between the substrate 10 and the light-emitting layer 20, and a touch electrode layer between the light-shielding layer 30 and the pixel definition layer 60. The anode layer includes a plurality of anode units 81, and the touch electrode layer includes a plurality of touch electrodes 91. The touch electrodes are metal electrodes.

Optionally, based on the above embodiment, in one embodiment of the present disclosure, as shown in FIG. 13, part of the metal units 71 and the anode units 81 are on a same layer, and another part of the metal units 71 and the touch electrodes 91 are on a same layer. Therefore, on the basis that the metal units are increased without increasing the thickness of the display panel, the plurality of metal units included in the metal layer are dispersedly disposed in a film layer occupied by the anode layer and a film layer occupied by the touch electrode layer, thereby reducing a difficulty in forming process.

It should be noted that, since a reflectivity of an anode unit is greater than a reflectivity of a touch electrode, in the above embodiment, a ratio of the area of the second light-transmitting holes corresponding to the metal units on a same layer as the anode units to the area of the first light-transmitting holes ranges from 20% to 40%, and a ratio of the area of the second light-transmitting holes corresponding to the metal units on a same layer as the touch units to the area of the first light-transmitting holes ranges from 40% to 50%, so that a reflectivity of an area where each second light-transmitting hole is located is basically equal.

In other embodiments of the present disclosure, the metal layer may also be at another position between the light-shielding layer and the pixel definition layer, which is not limited herein and depends on a specific situation.

It should be noted that, in the above embodiments, the display panel is described by taking an example that the pixel definition layer is a transparent film layer. In other embodiments of the present disclosure, the pixel definition layer may also be a black film layer. With reference to specific embodiments, the display panel will be described below by taking an example that the pixel definition layer is a black film layer.

Figure 14:
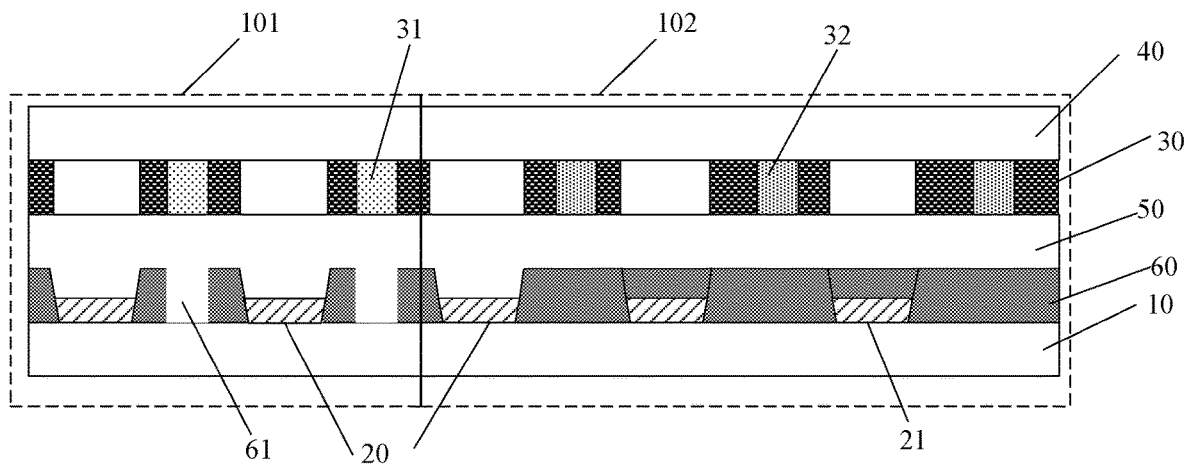
FIG. 14 illustrates a cross-sectional view of a display panel provided by another embodiment of the present disclosure.

Specifically, in one embodiment of the present disclosure, as shown in FIG. 14, the display panel includes the encapsulation film 50 encapsulating the light-emitting layer 20 and the pixel definition layer 60 between the substrate 10 and the encapsulation film 50. The pixel definition layer 60 is a black film layer. It should be noted that since the black film layer includes a function of light absorption, in the embodiment, the pixel defining layer 60 includes a plurality of first openings 61 corresponding to the first light-transmitting holes 31 to ensure that light transmitted by the first light-transmitting holes 31 can pass through the display panel, exit from a non-display side of the display panel, and is collected by a light collection device on the non-display side of the display panel.

Optionally, based on the above embodiment, in one embodiment of the present disclosure, a projection of the first light-transmitting holes 31 on the substrate 10 is within a projection range of the first openings 61 on the substrate 10, so that the light transmitted by the first light-transmitting holes 31 can all be transmitted through the first openings 61.

It should be noted that, when the pixel definition layer is a black film layer, the pixel definition layer includes a light-transmitting function. Therefore, when the area where the second light-transmitting holes are located corresponding to the pixel definition layer is not provided with openings, the proportion of the light-transmitting area per unit area of the second display area is at least twice the proportion of the light-transmitting area per unit area of the first display area so that the reflectivity of the second display area and the reflectivity of the first display area meet equal conditions, thereby reducing the display difference between the first display area and the second display area and improving a user's viewing experience.

Specifically, based on the above embodiment, in one embodiment of the present disclosure, a density of the first light-transmitting holes in the first display area and a density of the second light-transmitting holes in the second display area meet equal conditions, and the area of the second light-transmitting holes is at least twice the area of the first light-transmitting holes, so that the proportion of the light-transmitting area per unit area of the second display area is at least twice the proportion of the light-transmitting area per unit area of the first display area. The density of the first light-transmitting holes in the first display area and the density of the second light-transmitting holes in the second display area meeting equal conditions includes the density of the first light-transmitting holes in the first display area being equal to the density of the second light-transmitting holes in the second display area and includes the density of the first light-transmitting holes in the first display area being approximately equal to the density of the second light-transmitting holes in the second display area.

In another embodiment of the present disclosure, the area of the first light-transmitting holes in the first display area and the area of the second light-transmitting holes in the second display area meet an equal conditions, and the density of the second light-transmitting holes in the second display area is at least twice the density of the first light-transmitting holes in the first display area, so that the proportion of the light-transmitting area per unit area of the second display area is at least twice the proportion of the light-transmitting area per unit area of the first display area.

Figure 15:
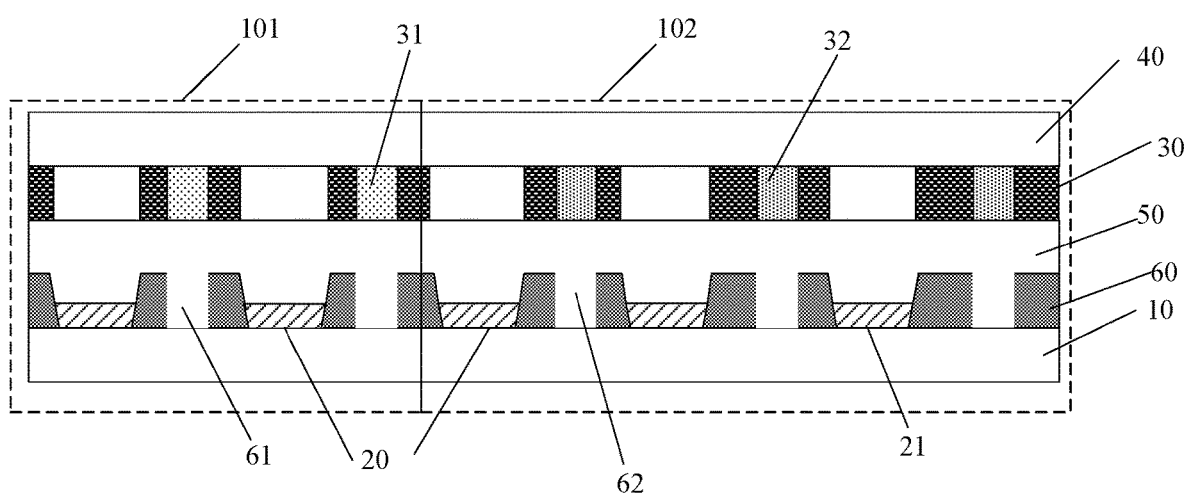
FIG. 15 illustrates a cross-sectional view of a display panel provided by another embodiment of the present disclosure.

In another embodiment of the present disclosure, as shown in FIG. 15, the pixel definition layer 60 further includes a plurality of second openings 62 corresponding to the second light-transmitting holes 32, so that an absorption of light transmitted by the second light-transmitting holes 32 by the pixel definition layer 60 is reduced by disposing the second opening 62 in the pixel definition layer 60. Optionally, in one embodiment of the present disclosure, a projection of the second light-transmitting holes 32 on the substrate 10 is within a projection range of the second openings 62 on the substrate 10, so that the light transmitted by the second light-transmitting holes 32 can all be transmitted through the second openings 62.

It should be noted that, when the pixel definition layer is provided with first openings and second openings at a same time, an absorption effect of the pixel definition layer on light transmitted by the first light-transmitting holes and the second light-transmitting holes is very weak. Therefore, in the embodiment, the proportion of the light-transmitting area per unit area of the first display area and the proportion of the light-transmitting area per unit area of the second display area meet equal conditions.

Based on the above embodiment, in one embodiment of the present disclosure, the area of the first light-transmitting holes and the area of the second light-transmitting holes meet equal conditions, so that the reflectivity of the area where the first light-transmitting holes are located and the reflectivity of the area where the second light-transmitting holes are located meet equal conditions, so that the reflectivity of the first display area and the reflectivity of the second display area meet equal conditions, thereby reducing the display difference between the first display area and the second display area and improving a user's viewing experience.

Figure 16:
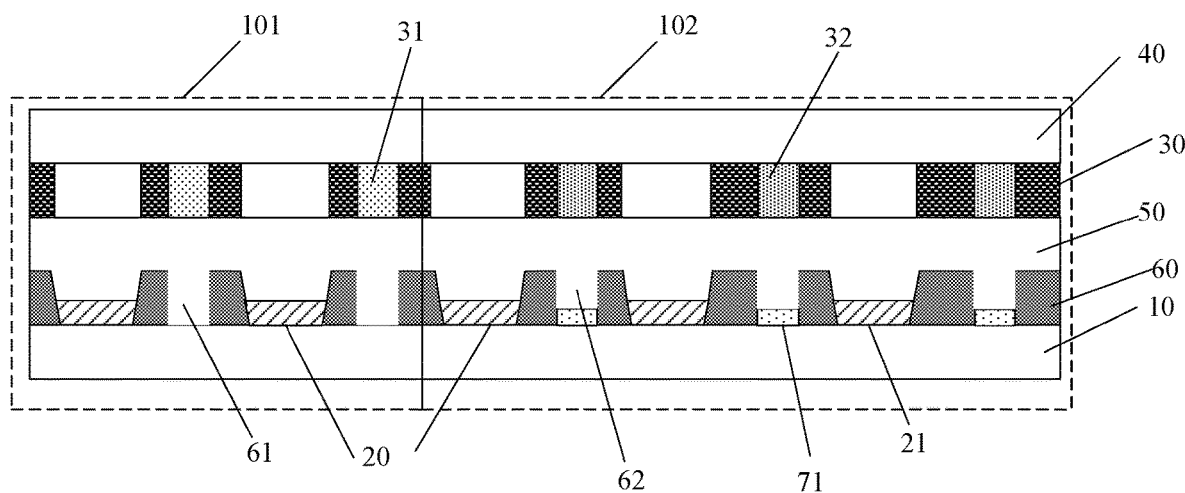
FIG. 16 illustrates a cross-sectional view of a display panel provided by another embodiment of the present disclosure.

In another embodiment of the present disclosure, as shown in FIG. 16, the display panel further includes a metal layer on a side of the pixel definition layer 60 facing the substrate 10. The metal layer includes a plurality of metal units 71. In a direction perpendicular to a plane of the display panel, the metal units 71 are in one-to-one correspondence with the second light-transmitting holes 32 to improve the reflectivity of the area where the second light-transmitting holes 32 are located by using the metal units 71. It should be noted that, since the metal units corresponding to the area where the second light-transmitting holes are located can improve the reflectivity of the area where the second light-transmitting holes are located, in the embodiment, the area of the second light-transmitting holes is smaller than the area of the first light-transmitting holes, so that the reflectivity of the area where the second light-transmitting holes are located and the reflectivity of the area where the first light-transmitting holes are located meet equal conditions. Therefore, an area ratio of the second light-transmitting holes in the second display area is reduced, so that the second display area may have a larger area for disposing an opening area and/or provide a larger layout space for wiring, thereby increasing the aperture ratio of the second display area and reducing the wiring difficulty of the second display area.

It should also be noted that, in the above embodiment, since the pixel definition layer is a black film layer, the metal layer is located on a side of the pixel definition layer facing the substrate, that is, the metal layer is on a side of the pixel definition layer away from the light-shielding layer. Therefore, in the embodiment of the present disclosure, the pixel definition layer is provided with second openings in an area corresponding to the second light-transmitting holes, to ensure that light transmitted by the second light-transmitting holes can be irradiated on the metal units through the second openings and be reflected by the metal units, thereby achieving an effect of using the metal units to improve reflectivity.

Based on the above embodiment, in one embodiment of the present disclosure, the area of the second light-transmitting holes is less than or equal to half of the area of the first light-transmitting holes, so as to reduce the area of the second light-transmitting holes as much as possible on the basis that the reflectivity of the area where the second light-transmitting holes are located and the reflectivity of the area where the first light-transmitting holes are located meet equal conditions, thereby reducing the ratio of the area of the second light-transmitting holes in the second display area, increasing the aperture ratio of the second display area, and reducing the wiring difficulty of the second display area.

Figure 17:
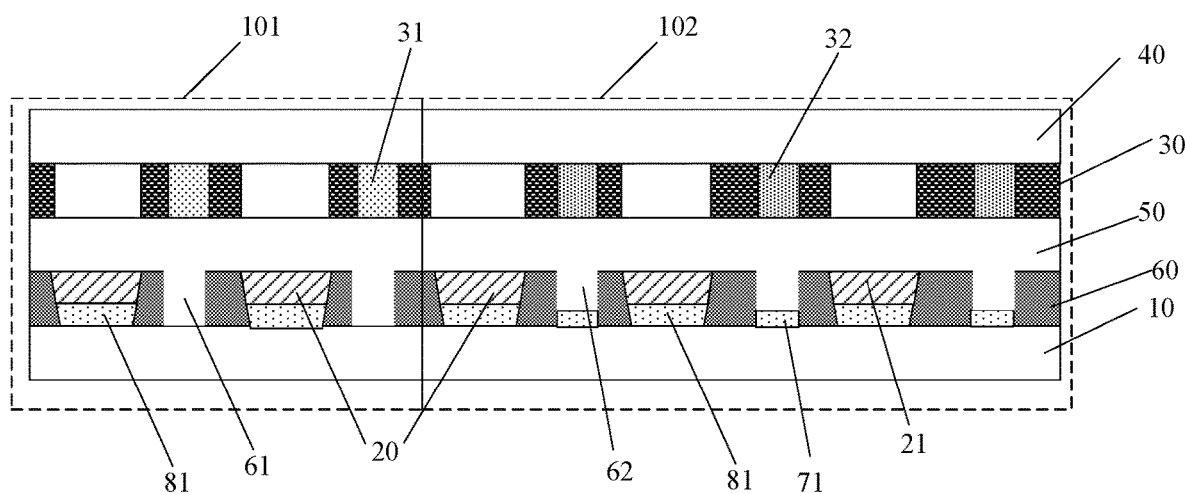
FIG. 17 illustrates a cross-sectional view of a display panel provided by another embodiment of the present disclosure.

Based on the above embodiment, in one embodiment of the present disclosure, as shown in FIG. 17, the display panel further includes an anode layer between the substrate 10 and the light-emitting layer 20. The anode layer is a control electrode layer that controls a light emission of the light-emitting layer. Specifically, the anode layer includes a plurality of anode units 81 in one-to-one correspondence with the light-emitting units 21.

Optionally, based on the above embodiment, in one embodiment of the present disclosure, the metal layer and the anode layer are located on a same layer, that is, the anode unit 81 and the metal unit 71 are on a same layer, so that the display panel does not increase a thickness of the display panel due to a provision of the metal layer on the basis of integrating the metal layer, thereby complying with a development trend of the display panel being light and thin. It should be noted that, in the embodiments of the present disclosure, if a normal operation of the light-emitting units is not affected, the metal units and the anode units may be electrically insulated or electrically connected, which are not limited herein and depend on a specific situation.

Specially, based on the above embodiment, in one embodiment of the present disclosure, a ratio of the area of the second light-transmitting holes to the area of the first light-transmitting holes ranges from 20% to 40%, so as to reduce the area of the second light-transmitting holes as much as possible on the basis that the reflectivity of the area where the second light-transmitting holes are located and the reflectivity of the area where the first light-transmitting holes are located meet equal conditions, thereby reducing the ratio of the area of the second light-transmitting holes in the second display area, increasing the aperture ratio of the second display area and reducing the wiring difficulty of the second display area.

In other embodiments of the present disclosure, the metal layer may also be disposed at another position between the pixel definition layer and the substrate, which is not limited herein and depends on a specific situation.

It should be noted that, the above embodiments are described by taking an example that the metal layer is on a side of the pixel definition layer facing the substrate, which are not limited herein. In other embodiments of the present disclosure, the metal layer may also be on a side of the pixel definition layer away from the substrate. It should be noted that when the metal layer is between the pixel definition layer and the light-shielding layer, light transmitted by the second light-transmitting holes reaches the metal units and is reflected by the metal units first and is not absorbed by the pixel definition layer. Therefore, in the embodiment, a position of the pixel definition layer corresponding to the second light-transmitting holes may not be provided with second openings.

Figure 18:
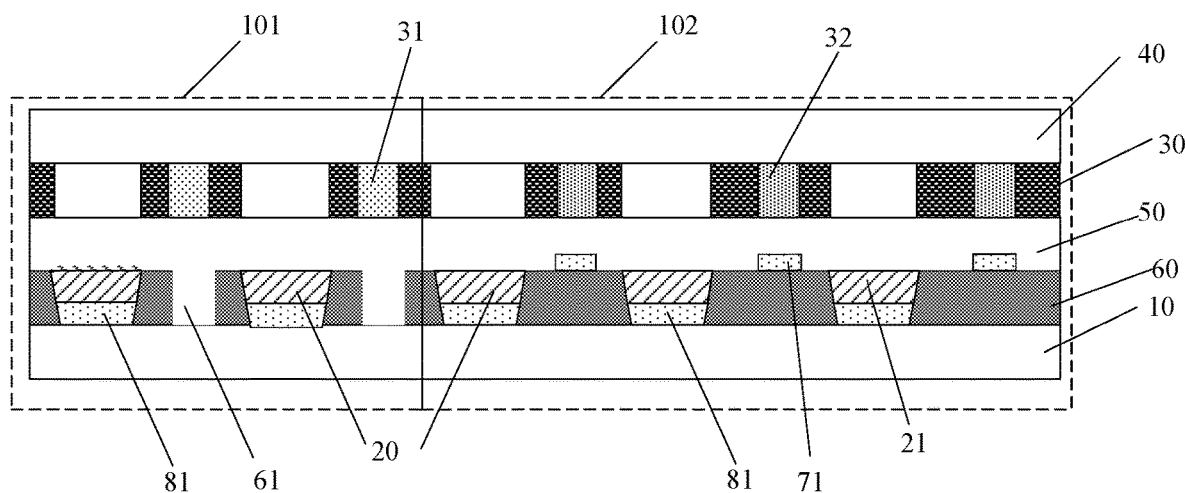
FIG. 18 illustrates a cross-sectional view of a display panel provided by another embodiment of the present disclosure.

Specifically, in one embodiment of the present disclosure, as shown in FIG. 18, the display panel further includes a metal layer between the light-shielding layer 30 and the pixel definition layer 60. The metal layer includes a plurality of metal units 71. In a direction perpendicular to a plane of the display panel, the metal units 71 correspond to the second light-transmitting holes 32 one-to-one. The area of the second light-transmitting holes 32 is smaller than the area of the first light-transmitting holes 31.

Figure 19:
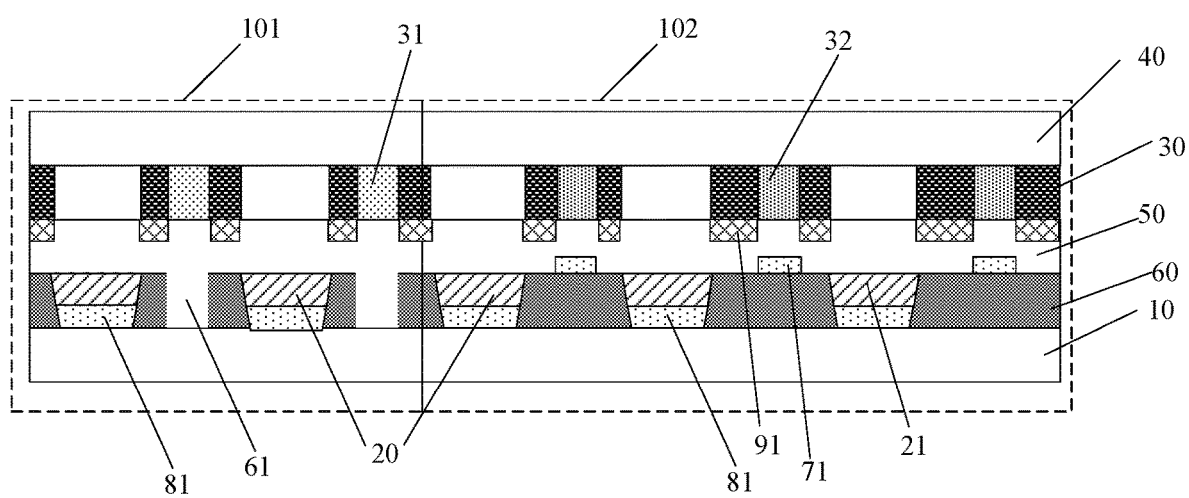
FIG. 19 illustrates a cross-sectional view of a display panel provided by another embodiment of the present disclosure.

Optionally, based on the above embodiment, in one embodiment of the present disclosure, as shown in FIG. 19, the display panel further includes a touch electrode layer on a side of the light-shielding layer 30 facing the light-emitting layer 20. The touch electrode layer includes a plurality of touch electrodes 91, so that the display panel is integrated with a touch function and an integration degree of the display panel is improved.

Figure 20:
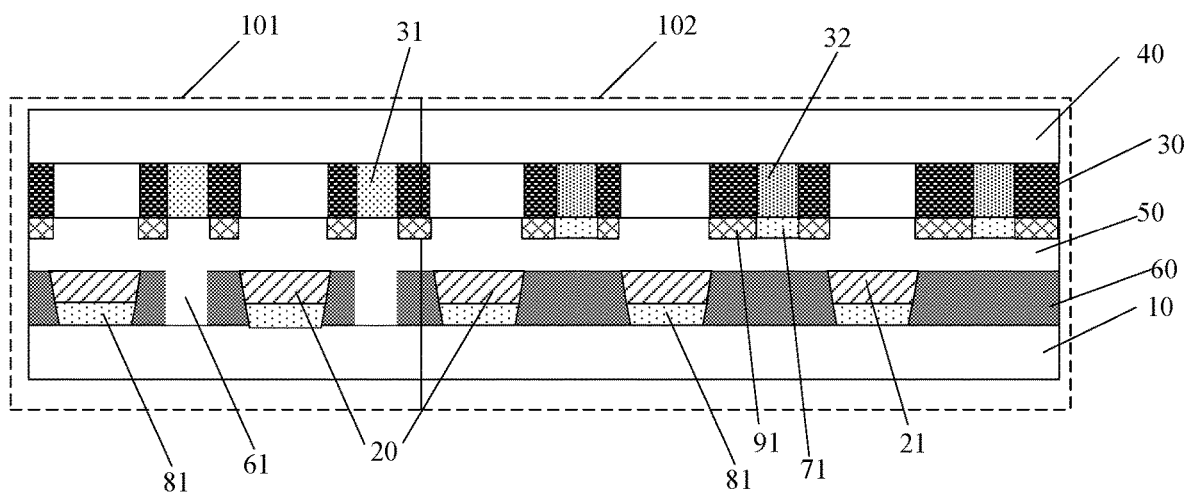
FIG. 20 illustrates a cross-sectional view of a display panel provided by another embodiment of the present disclosure.

Specifically, in one embodiment of the present disclosure, the touch electrodes are metal electrodes to reduce resistances of the touch electrodes. It should be noted that, in the embodiment, as shown in FIG. 20, when the display panel further includes metal units 71, the metal units 71 may also be on a same layer as the touch electrodes 91, thereby not increasing a thickness of the display panel due to an arrangement of the metal units 71 and complying with a development trend of the display panel being light and thin.

Optionally, in the above embodiment, since materials of the touch electrodes and the metal units are metals, in one embodiment of the present disclosure, the touch electrodes can also be multiplexed into metal units, thereby further simplifying a forming process of the display panel, reducing weight and area of the display panel are reduced and complying with a development trend of the display panel being light and thin.

Specifically, based on the above embodiment, in one embodiment of the present disclosure, the ratio of the area of the second light-transmitting holes to the area of the first light-transmitting holes ranges from 40% to 50%, so as to reduce the area of the second light-transmitting holes as much as possible on the basis that the reflectivity of the area where the second light-transmitting holes are located and the reflectivity of the area where the first light-transmitting holes are located meet equal conditions, thereby reducing the ratio of the area of the second light-transmitting holes in the second display area, increasing the aperture ratio of the second display area and reducing the wiring difficulty of the second display area.

Figure 21:
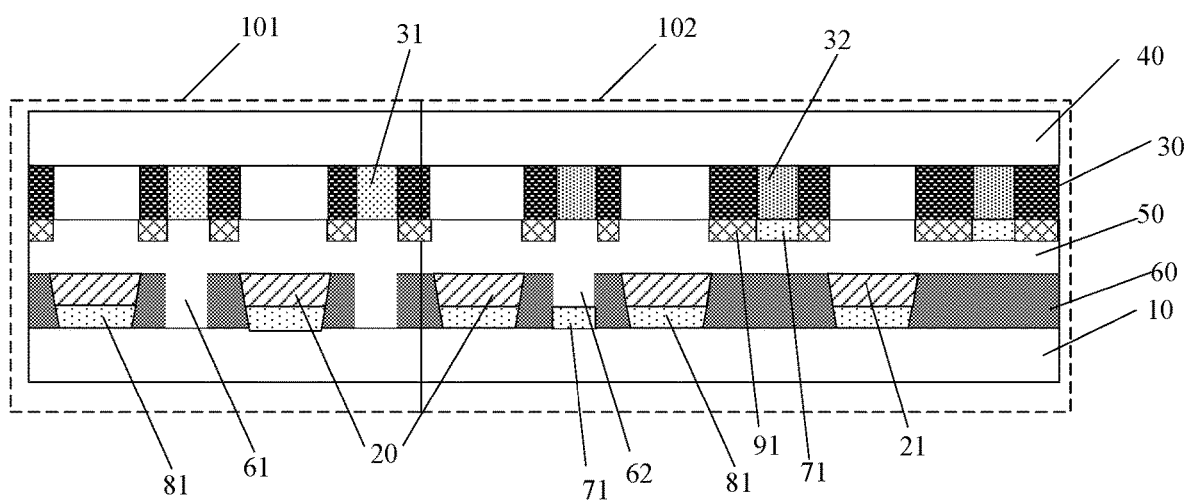
FIG. 21 illustrates a cross-sectional view of a display panel provided by another embodiment of the present disclosure.

In another embodiment of the present disclosure, the display panel includes both an anode layer and a touch electrode layer. That is, in the embodiment, as shown in FIG. 21, the display panel further includes an anode layer between the substrate 10 and the light-emitting layer 20, and a touch electrode layer between the light-shielding layer 30 and the pixel definition layer 60. The anode layer includes a plurality of anode units 81, and the touch electrode layer includes a plurality of touch electrodes 91. The touch electrodes are metal electrodes.

Optionally, based on the above embodiment, in one embodiment of the present disclosure, as shown in FIG. 21, part of the metal units 71 and the anode unit 81 are on a same layer, and another part of the metal units 71 and the touch electrodes 91 are on a same layer. Therefore, on the basis that the metal units are increased without increasing the thickness of the display panel, the plurality of metal units included in the metal layer are dispersedly disposed in a film layer occupied by the anode layer and a film layer occupied by the touch electrode layer, thereby reducing a difficulty in forming process.

It should be noted that, since a reflectivity of an anode unit is greater than a reflectivity of a touch electrode, in the above embodiment, a ratio of the area of the second light-transmitting holes corresponding to the metal units on a same layer as the anode units to the area of the first light-transmitting holes ranges from 20% to 40%, and a ratio of the area of the second light-transmitting holes corresponding to the metal units on a same layer as the touch units to the area of the first light-transmitting holes ranges from 40% to 50%, so that a reflectivity of an area where each second light-transmitting hole is located is basically equal. For ease of description, the metal units on a same layer as the anode layer is first metal units, and the metal units on a same layer as the touch electrode layer is second metal units. A ratio of the area of the second light-transmitting holes corresponding to the first metal units to the area of the first light-transmitting holes ranges from 20% to 40%, and a ratio of the area of the second light-transmitting holes corresponding to the second metal units to the area of the first light-transmitting holes ranges from 40% to 50%.

It should also be noted that since the anode layer is on a side of the pixel definition layer away from the light-shielding layer, the touch electrode layer is on a side of the pixel definition layer facing the light-shielding layer, light transmitted by the second light-transmitting holes pass through a film layer where the touch electrode layer is located first, pass through a film layer where the pixel definition layer is located, and reach a film layer where the anode layer is located. Therefore, in the embodiment, the second openings 62 are provided at a position corresponding to the first metal units in the pixel definition layer 60, and the second openings are not provided at a position corresponding to the second metal units.

In other embodiments of the present disclosure, the metal layer may also be at another position between the light-shielding layer and the pixel definition layer, which is not limited herein and depends on a specific situation.

Based on any of the above embodiments, in a specific embodiment of the present disclosure, the area of the first light-transmitting holes is 2×2 mm or 2×3 mm, which is not limited herein and depends on a specific situation.

It should be noted that, in other embodiments of the present disclosure, the display panel may also include other structures in the display panel, such as a cathode layer, a control circuit layer and other structures, which are well known to a person skilled in the art and are not described in detail in the disclosure.

Based on any of the above embodiments, in one embodiment of the present disclosure, the light collection device is an image collection device. In another embodiment of the present disclosure, the light collection device is a fingerprint collection device. In other embodiments of the present disclosure, the light collection device may also be another light collection device, which is not limited herein and depends on a specific situation.

As disclosed, in the display panel and the display device including the display panel provided by the embodiments of the present disclosure, in addition that the first light-transmitting holes are disposed in the non-opening area of the first display area so that the first display area includes a light collection area, the second light-transmitting holes are disposed in the non-opening area of the second display area. That is, in addition that the first light-transmitting holes are disposed in the light collection area, the second light-transmitting holes are also disposed in the non-light collection area. Therefore, by disposing light-transmitting holes in the non-opening area of the display area (i.e., the second display area) of the non-light collection area, a reflectivity of the display area (i.e., the second display area) of the non-light collection area is increased, thereby reducing a reflectivity difference between the light collection area and the non-light collection area, that is, reducing a reflectivity difference between the first display area and the second display area. Further, a display difference between the light collection area and the non-light collection area is reduced, that is, a display difference between the first display area and the second display area is reduced, thereby improving a user's viewing experience.

In the present specification, each embodiment is described in a progressive manner, or in parallel or in a combination of thereof. Each embodiment focuses on differences from other embodiments, so same and similar parts between various embodiments can be referred to each other. Since the device disclosed in the embodiments corresponds to the method disclosed in the embodiments, the description is relatively simple, and relevant parts can be referred to the description of the method.

It should be noted that, in the description of the present disclosure, an orientation or a positional relationship indicated by the terms "upper", "lower", "top", "bottom", "inner", "outer", etc. is based on the orientation or positional relationship shown in the accompanying drawings, and is only for the convenience of describing the present disclosure and simplified description, rather than indicating or implying that the device or element referred to must have a particular orientation, be constructed and operate in a particular orientation, and therefore should not be construed as limiting the present disclosure. When a component is said to be "connected" to another component, the component can be directly connected to the other component or there may be a centered component at a same time.

It needs to note that in the specification, relationship terms such as first and second are just used to distinguish one entity or operation from another entity or operation but does not necessarily require or suggest that any such actual relationship or sequence exists among these entities or operations. Furthermore, terms of "including", "comprising" or any other variants intend to cover non-exclusive containing, so that an object or a device containing a series of elements not only comprise those elements, but also comprise other elements not listed explicitly, or further comprise elements inherent to such object or device. In the case of no further limitation, an element defined by an expression of "comprising one . . . " does not exclude that there exists additional same element in the process, method, objects, or device comprising the element.

The above description of the disclosed embodiments is provided to enable a person skilled in the art to make or use the present disclosure. Various modifications to the embodiments will be readily apparent to a person skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. A display panel, comprising a substrate, a light-emitting layer on a first side of the substrate, a light-shielding layer on a side of the light-emitting layer away from the substrate, an encapsulation film encapsulating the light-emitting layer and a pixel definition layer between the substrate and the encapsulation film, wherein:

a first area of the light-shielding layer includes a plurality of first light-transmitting holes, and a second area of the light-shielding layer includes a plurality of second light-transmitting holes;

the display panel includes a first display area and a second display area, the first display area is a light collection area, the first area of the light-shielding layer is in a non-opening area of the first display area, the second display area is a non-light collection area, and the second area of the light-shielding layer is in a non-opening area of the second display area;

the pixel definition layer is a black film layer, and the pixel definition layer includes a plurality of first openings corresponding to the plurality of first light-transmitting holes; and a proportion of a light-transmitting area per unit area of the second display area is at least twice a proportion of a light-transmitting area per unit area of the first display area.

2. The display panel according to claim 1, wherein an area of the plurality of second light-transmitting holes is at least twice an area of the plurality of first light-transmitting holes.

3. The display panel according to claim 1, wherein an area of the plurality of second light-transmitting holes and an area of the plurality of first light-transmitting holes meet equal conditions, and a density of the plurality of second light-transmitting holes is at least twice a density of the plurality of first light-transmitting holes.

4. The display panel according to claim 1, wherein the pixel definition layer also includes a plurality of second openings corresponding to the plurality of second light-transmitting holes.

5. A display device, comprising a display panel according to claim 1.

6. A display panel, comprising a substrate, a light-emitting layer on a first side of the substrate, a light-shielding layer on a side of the light-emitting layer away from the substrate, an encapsulation film encapsulating the light-emitting layer, a pixel definition layer between the substrate and the encapsulation film, and a metal layer on a side of the pixel definition layer facing the substrate, wherein:
- a first area of the light-shielding layer includes a plurality of first light-transmitting holes, and a second area of the light-shielding layer includes a plurality of second light-transmitting holes;
- the display panel includes a first display area and a second display area, the first display area is a light collection area, the first area of the light-shielding layer is in a non-opening area of the first display area, the second display area is a non-light collection area, and the second area of the light-shielding layer is in a non-opening area of the second display area;
- the pixel definition layer is a transparent film layer;
- the metal layer includes a plurality of metal units;
- in a direction perpendicular to a plane where the display panel is located, the plurality metal units is in one-to-one correspondence with the plurality of second light-transmitting holes; and
- an area of the plurality of second light-transmitting holes is smaller than an area of the plurality of the first light-transmitting holes.

7. The display panel according to claim 6, wherein a proportion of a light-transmitting area per unit area of the first display area and a proportion of a light-transmitting area per unit area of the second display area meet equal conditions.

8. The display panel according to claim 6, wherein a ratio of the area of the plurality of second light-transmitting holes to the area of the plurality of the first light-transmitting holes ranges from 40% to 50%.

9. The display panel according to claim 6, wherein an area of the plurality of second light-transmitting holes is less than or equal to half an area of the plurality of the first light-transmitting holes.

10. The display panel according to claim 9, further comprising an anode layer between the substrate and the light-emitting layer, wherein:
- the anode layer includes a plurality of anode units, and the metal layer and the anode layer are on a same layer.

11. The display panel according to claim 10, wherein a ratio of the area of the plurality of second light-transmitting holes to the area of the plurality of the first light-transmitting holes ranges from 20% to 40%.

12. The display panel according to claim 6, further comprising an anode layer between the substrate and the light-emitting layer, and a touch electrode layer between the light-shielding layer and the pixel definition layer, wherein:
- the touch electrode layer includes a plurality of touch electrodes;
- the anode layer includes a plurality of anode units, and touch electrodes of the plurality of touch electrodes are metal electrodes; and
- part of the metal units and the plurality of anode units are on a same layer, and another part of the metal units and the plurality of touch electrodes are on a same layer.

13. A display device, comprising a display panel according to claim 6.

14. A display panel, comprising a substrate, a light-emitting layer on a first side of the substrate, a light-shielding layer on a side of the light-emitting layer away from the substrate, an encapsulation film encapsulating the light-emitting layer, a pixel definition layer between the substrate and the encapsulation film, and a metal layer between the light-shielding layer and the pixel definition layer, wherein:
- a first area of the light-shielding layer includes a plurality of first light-transmitting holes, and a second area of the light-shielding layer includes a plurality of second light-transmitting holes;
- the display panel includes a first display area and a second display area, the first display area is a light collection area, the first area of the light-shielding layer is in a non-opening area of the first display area, the second display area is a non-light collection area, and the second area of the light-shielding layer is in a non-opening area of the second display area;
- the pixel definition layer is a transparent film layer;
- the metal layer includes a plurality of metal units;
- in a direction perpendicular to a plane where the display panel is located, the plurality of metal units is in one-to-one correspondence with the plurality of second light-transmitting holes; and
- an area of the plurality of second light-transmitting holes is smaller than an area of the plurality of the first light-transmitting holes.

15. The display panel according to claim 14, further comprising a touch electrode layer on a side of the light-shielding layer facing the light-emitting layer, and the touch electrode layer including a plurality of touch electrodes.

16. The display panel according to claim 15, wherein touch electrodes of the plurality of touch electrodes are metal electrodes, and the metal electrodes and the plurality of metal units are on a same layer.

17. The display panel according to claim 15, wherein at least part of the touch electrodes is multiplexed into metal units.

18. The display panel according to claim 17, wherein a ratio of the area of the plurality of second light-transmitting holes to the area of the plurality of the first light-transmitting holes ranges from 40% to 50%.

19. A display device, comprising a display panel according to claim 14.

* * * * *